(12) United States Patent
Ko et al.

(10) Patent No.: US 11,626,525 B2
(45) Date of Patent: Apr. 11, 2023

(54) PACKAGE STRUCTURE AND METHOD FOR MANUFACTURING THE SAME

(71) Applicant: Advanced Semiconductor Engineering, Inc., Kaohsiung (TW)

(72) Inventors: Chun Yu Ko, Kaohsiung (TW); Tsu-Hsiu Wu, Kaohsiung (TW); Meng-Jen Wang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 17/013,350

(22) Filed: Sep. 4, 2020

(65) Prior Publication Data
US 2022/0077326 A1 Mar. 10, 2022

(51) Int. Cl.
*H01L 31/0203* (2014.01)
*H01L 31/0232* (2014.01)
*H01L 31/02* (2006.01)
*H01L 23/00* (2006.01)

(52) U.S. Cl.
CPC ........ *H01L 31/02325* (2013.01); *H01L 24/16* (2013.01); *H01L 31/02002* (2013.01); *H01L 31/0203* (2013.01); *H01L 2224/1601* (2013.01); *H01L 2224/16227* (2013.01)

(58) Field of Classification Search
None
See application file for complete search history.

(56) References Cited

U.S. PATENT DOCUMENTS

| 6,740,862 | B2 | 5/2004 | Paritsky et al. | |
|---|---|---|---|---|
| 2013/0127004 | A1* | 5/2013 | Ru | H01L 27/14683 438/66 |
| 2017/0141257 | A1* | 5/2017 | Tsai | H01L 31/173 |
| 2020/0168757 | A1* | 5/2020 | Lin | H01L 31/03046 |

FOREIGN PATENT DOCUMENTS

CN 203895460 U * 10/2014

* cited by examiner

*Primary Examiner* — Hung K Vu
(74) *Attorney, Agent, or Firm* — Foley & Lardner LLP (57) ABSTRACT

A package structure is provided. The package structure includes a substrate, a sensor device, an encapsulant and a signal blocking structure. The substrate has a signal passing area. The sensor device is disposed over the substrate. The sensor device has a first surface, a second surface opposite to the first surface and a sensing area located at the second surface. The second surface of the sensor device faces the substrate. The encapsulant covers the sensor device and the substrate. The signal blocking structure extends from the substrate into the encapsulant.

18 Claims, 9 Drawing Sheets

PACKAGE STRUCTURE AND METHOD FOR MANUFACTURING THE SAME

BACKGROUND

1. Field of the Disclosure

The present disclosure relates to a package structure including a sensor device, especially an optical sensor package structure, and to a method for manufacture the package structure.

2. Description of the Related Art

Optical sensor packages have been extensively used in consumer electronics. In an optical sensor package a sensor is disposed on and wire-bonded to a substrate. It is desired that the size of the optical sensor package can be further reduced while maintaining the performance of the optical sensor package.

SUMMARY

In some embodiments, a package structure includes a substrate, a sensor device, an encapsulant and a signal blocking structure. The substrate has a signal passing area. The sensor device is disposed over the substrate. The sensor device has a first surface and a second surface opposite to the first surface. The sensor device has a sensing area located at the second surface. The second surface of the sensor device faces the substrate. The encapsulant covers the sensor device and the substrate. The signal blocking structure extends from the substrate into the encapsulant.

In some embodiments, a package structure includes a substrate, a sensor device, an encapsulant and a barrier. The substrate has an opening. The sensor device is electrically connected to the substrate and has a sensing area facing the opening of the substrate. The encapsulant covers the sensor device and the substrate and fills the opening of the substrate. The barrier penetrates through the substrate and extends into the encapsulant. The barrier surrounds the opening of the substrate and the sensing area of the sensor device.

In some embodiments, a method for manufacturing a package structure includes the following operations: providing a substrate; providing a sensor device having a first surface, a second surface and a sensing area located at the second surface; disposing the sensor device over the substrate, wherein the sensing area of the sensor device faces the substrate; forming an encapsulant covering the sensor device and the substrate; and forming a signal blocking structure extending from the substrate into the transparent encapsulant.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Present disclosure provides a package structure including a sensor device and a substrate. The sensor device is electrically bonded to the substrate and has a sensing area facing the substrate. The substrate has a signal passing area which allows the signal, e.g., light, to pass through and reach the sensing area of the sensor device. The package structure includes a barrier which functions as a shield and can prevent stray signals from entering the sensing area of the sensor device. By designing the configuration of the barrier, the amount of the stray signals entering the sensing area of the sensor device can be greatly reduced and the optical density (O.D.) of the package structure can be enhanced.

Figure 1:
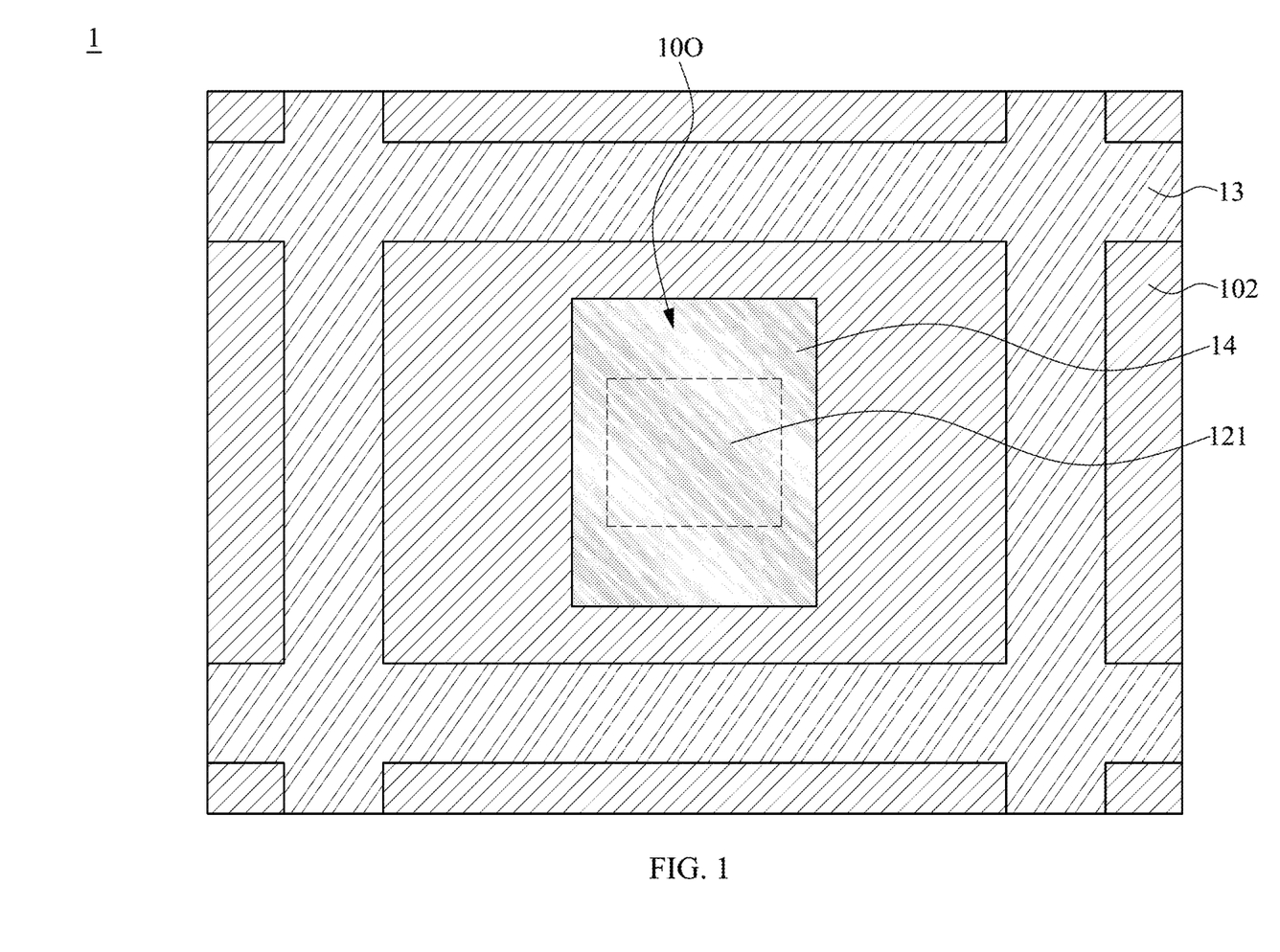
FIG. 1 illustrates a top view of a package structure according to some embodiments of the present disclosure.
Figure 2:
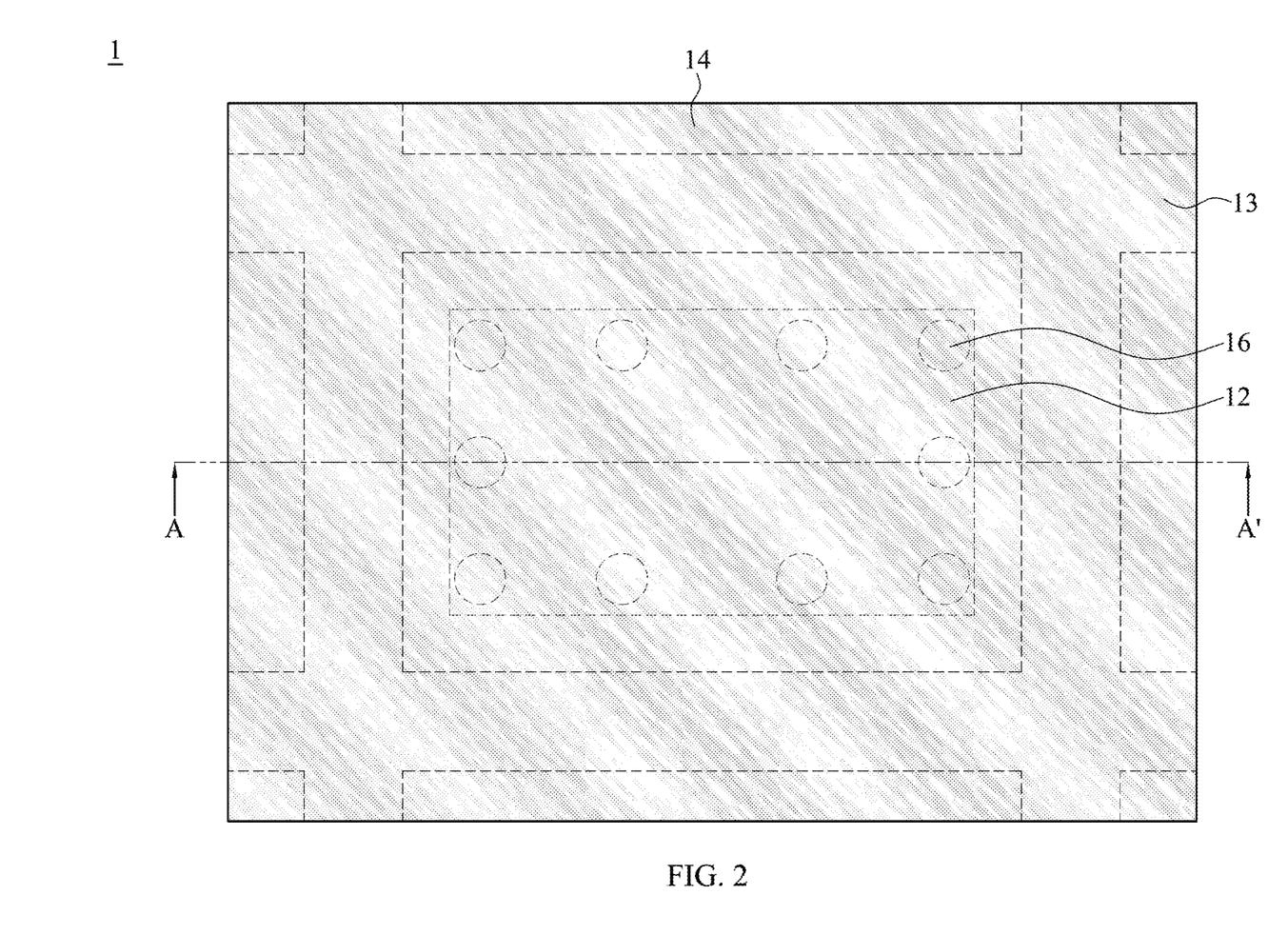
FIG. 2 illustrates a bottom view of the package structure of FIG. 1.
Figure 3:
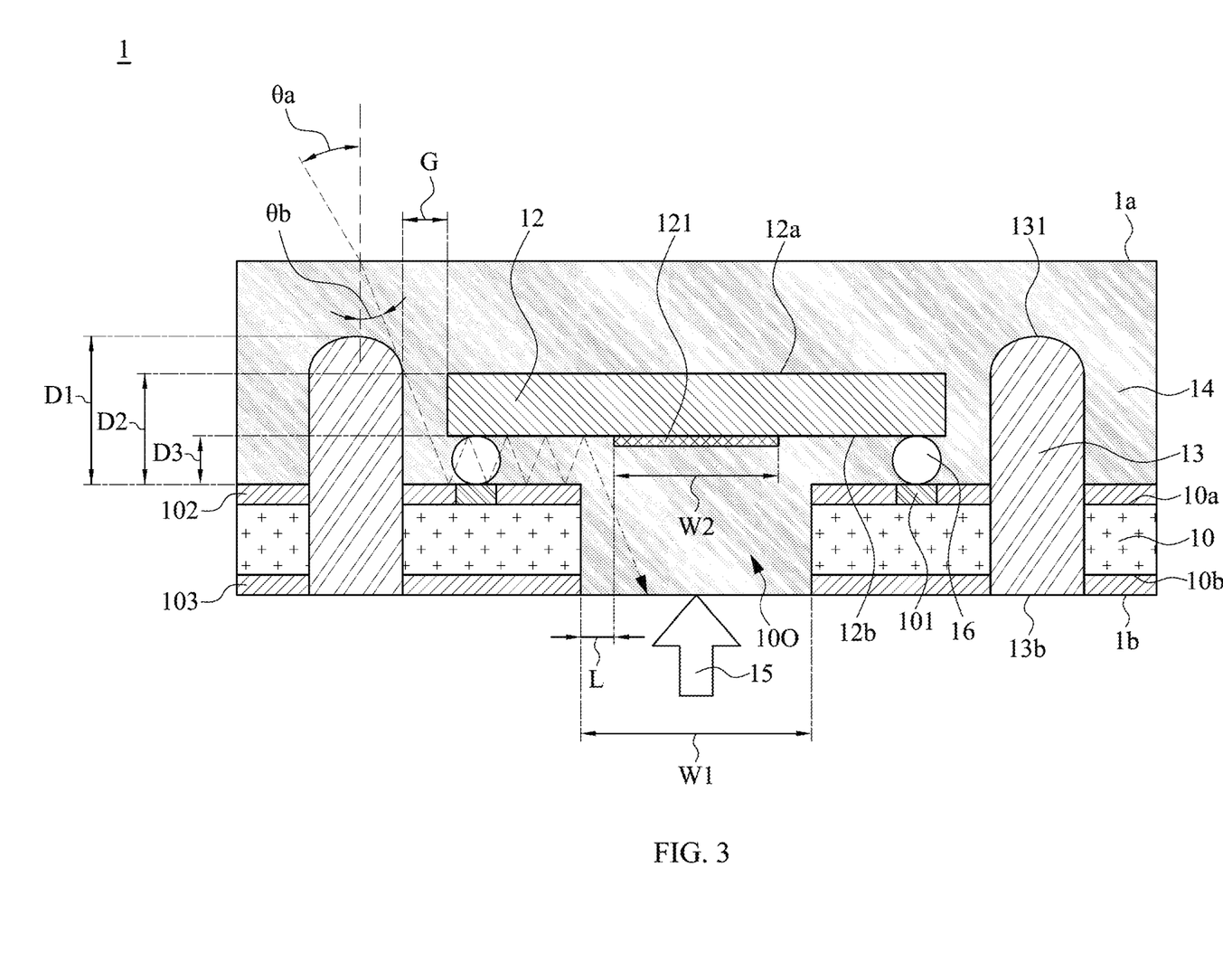
FIG. 3 illustrates a cross-sectional view taken along line A-A' of the package structure of FIG. 2.

FIG. 1 illustrates a top view of a package structure 1 according to some embodiments of the present disclosure. FIG. 2 illustrates a bottom view of the package structure 1 of FIG. 1. FIG. 3 illustrates a cross-sectional view taken along line A-A' of the package structure 1 of FIG. 2. The package structure 1 includes a substrate 10, a sensor device 12, an encapsulant 14 and a barrier 13.

The package structure 1 has a bottom side 1a and a top side 1b. In some embodiments, the package structure 1 can be a proximity sensor, an optical sensor or an ambient light sensor. The top side 1b faces signals 15 to be detected. The bottom side 1a may be disposed in an interior of an electronic device. The electronic device may include component(s) that may emit signals, such as light. The signals come from these components become stray signals and may enter the package structure 1, for example, from the bottom side 1a of the package structure 1 with an incident angle $\theta_a$ and a refraction angle $\theta_b$. If such stray signals reach and are detected by the sensor device 12, the performance of the sensor device 12 will be deteriorated.

The substrate 10 has a first surface 10a (e.g., a bottom surface) and a second surface 10b (e.g., a top surface) opposite to the first surface 10a. The substrate 10 includes pads 101 disposed on the first surface 10a. The substrate 10 may further include traces or other conductive connections (not shown) disposed on the first surface 10a or within the substrate 10. The substrate 10 includes a mask layer 102 disposed on the first surface 10a and surrounding the pads 101. In some embodiments, the substrate 10 may further include a mask layer 103 disposed on the second surface 10b. In some embodiment, the mask layers 102 and 103 can block, at least, light having a wavelength within a specific range (e.g., visible light having a wavelength within a range of about 400 nm to about 700 nm) from passing through it. The mask layers 102 and 103 block the light by reflecting it. In some embodiments, the mask layers 102 and 103 may reflect a portion of the light and absorb a portion of the light. The mask layers 102 and 103 may be made of the same material or made of different materials. The materials for preparing the mask layers 102 and 103 include light reflective materials (e.g., solder mask resin) or other suitable materials. The solder resin may include carbon black or pigment that can reflect or absorb light. In some embodiments, the material of the mask layers 102 and 103 has a light transmission of less than about 10%, less than about 5%, less than about 1%, or less than about 0.1% for a wavelength in the visible range.

The substrate 10 includes a window 10O so that signal 15 can enter the package structure 1 by passing through the window 10O of the substrate 10 and be detected by the sensor device 12. In some embodiments, the window 10O is also referred to as a signal passing area. In some embodiments, the signal passing area is a light passing area which allows light travels in and out. In some embodiments, the window 10O may be an opening penetrating through the substrate 10. In some other embodiments, the window 10O may be made of light transmissive material so that it allows light having a wavelength within a desired range to enter the package structure 1. The window 10O is not covered by the mask layer 102.

The substrate 10 may be a printed circuit board, for example but not limited thereto. In some other embodiments, the substrate 10 may be transparent. For examples, the substrate 10 may be a transparent glass substrate and has light reflective material disposed on the first surface 10a, the second surface 10b or both; in such embodiments, a portion of substrate 10 is not covered by light reflective material and constitutes a window 10O.

The sensor device 12 is disposed over the substrate 10. The sensor device 12 has a first surface 12a (e.g., a backside surface) and a second surface 12b (e.g., an active surface) opposite to the first surface 12a. The second surface 12b of the sensor device 12 faces the substrate 10. The sensor device 12 has a sensing area 121 located at the second surface 12b. The sensing area 121 may be embedded within the sensor device 12 or disposed on the second surface 12b of the sensor device 12. The sensor device 12 may include a sensing circuit disposed in the sensing area 121 for sensing or detecting signals 15. The signals 15 can be light, e.g., visible light or light having other wavelengths. The sensing area 121 of the sensor device 12 faces the window 10O of the substrate 10. In some embodiments, a size (e.g., a width W1) of the window 10O of the substrate 10 is greater than a size (e.g., a width W2) of the sensing area 121 of the sensor device 12. In some embodiments, the sensor device 12 may be or include an ASIC sensor die.

As shown in FIG. 3, the sensor device 12 is electrically connected to the substrate 10, for example, through a flip-chip bonding. That is, the second surface 12b of the sensor device 12 is electrically connected to the pads 101 of the substrate 10 through a plurality of conductive bumps (or balls) 16. Thus, a distance D3 from the second surface 12b of the sensor device 12 to the substrate 10 may be determined by a height of the bump 16. The conductive bumps (or balls) 16 may be arranged at a periphery of the second surface 12b of the sensor device 12 as illustrated in FIG. 2. The conductive bumps (or balls) 16 can be made of metal or alloy and do not allow light transmission.

The encapsulant 14 covers the sensor device 12 and the substrate 10. In some embodiments, the encapsulant 14 is disposed on the first surface 10a of the substrate 10. Specifically, the encapsulant 14 contacts the mask layer 102 disposed on the first surface 10a of the substrate 10. In some embodiments, the encapsulant 14 is disposed on the first surface 10a of the substrate 10 and fills the opening 10O. In some embodiments, the encapsulant 14 may be transparent and made of a transparent material, such as an optical molding compound. The optical molding compound may be an epoxy resin. In some embodiments, the optical molding compound does not contain fillers. In some embodiments, the transparent material of the encapsulant 14 has a light transmission of at least about 60%, at least about 70%, or at least about 80% for a wavelength in the visible range. The wavelength in the visible range may be in a range of 400 nm to 700 nm.

The barrier 13 may function as a shield and prevent stray signals from entering the sensing area 121 of the sensor device 12. Thus, the barrier may be referred to as a signal blocking structure according to some embodiments in the present disclosure. In some embodiments, the signal blocking structure is a light blocking structure.

In some embodiments, one or more barriers 13 can be disposed adjacent to one or more lateral surfaces of the sensor device 12. In the embodiments as illustrated in FIGS. 1 to 3, the barrier 13 may surround the sensor device 12 (i.e., formed along the periphery of the sensor device 12) and has a ring-like shape. The barrier 13 can be made of materials that can block undesired stray signals. The barrier 13 may be opaque. In some embodiments, the barrier 13 can be made of a light blocking material having a high optical density (O.D.), such as 3.0 or more, 3.5 or more, 4 or more, 4.5 or more, 5.0 or more, 5.5 or more, or 6.0 or more, and the light blocking material may include a resin, for example, an underfill epoxy resin. The optical density (O.D.) is defined as the common logarithm of the ratio of incident to transmitted radiant power through a material (e.g., the common logarithm of the ratio of incident to transmitted light through a material).

The barrier 13 penetrates through the substrate 10 (including the mask layer 102 disposed on the first surface 10a) and extends into the encapsulant 14. Thus, the barrier 13 has a protrusion portion protruding from the first surface 10a of the substrate 10 (or the mask layer 102) and covered by the encapsulant 14. The barrier 13 has a surface 13b (i.e., a top surface) and a distal end 131 opposite to the surface 13b. The distal end 131 is located at an end of the protrusion portion of the barrier 13. The distal end 131 may be in a round shape. In some embodiments, the surface 13b of the barrier 13 is exposed from the second surface 10b of the substrate 10 and may be covered or not covered by the mask layer 103. In some embodiments, the barrier 13 penetrates through the substrate 10 (including the mask layer 102 and the mask layer 103) and the surface 13b of the barrier 13 is exposed from the mask layer 103.

In some embodiments, a distance D1 from a distal end 131 of the barrier (or signal blocking structure) 13 to the substrate 10 is greater than a distance D3 from the second surface 12b of the sensor device 12 to the substrate 10. As discussed above, D3 is determined by the height of the bumps 16. Although the bumps 16 are opaque, they are not closely arranged and do not directly contact with each other. Thus, there are gaps between two adjacent bumps. The gaps may be filled by the encapsulant 14. Stray signals (e.g. stray light) may reach the sensing area 121 by passing through the transparent encapsulant 14 filled in the gaps. In the embodiments where D1 is greater than D3, the barrier 13 functions as a shield to block stray signals, especially those from a horizontal direction, so that an amount of stray signals reaching the sensing area 121 can be greatly reduced.

In some embodiments, the distance D1 from the distal end 131 of the barrier 13 to the substrate 10 is greater than a distance D2 from the first surface 12a of the sensor device 12 to the substrate 10. Since D2 is greater than D3, in these embodiments the barrier 13 can block stray signals (e.g., light), especially those from a horizontal direction and thus an amount of stray signals reaching the sensing area 121 can be greatly reduced.

In the present disclosure, the distance(s) from a specific point to the substrate 10 (e.g., the distance D1, D2 or D3) refers to the smallest distance from said point to the substrate 10 (e.g., from said point to the mask layer 102 of substrate 10 when the mask layer 102 is present).

In some embodiments, a smallest horizontal distance L from an edge of the sensing area 121 to an edge of the window 10O of the substrate 10 meets the following equation:

$$L > \frac{D3}{D2} \times G \tag{1}$$

wherein D2 is a distance from the first surface 12a of the sensor device 12 to the substrate 10, D3 is a distance from the second surface 12b of the sensor device 12 to the substrate 10, and G is a smallest horizontal distance from an edge of the first surface 12a of the sensor device 12 to the barrier 13. In some further embodiments, L can be greater than 0.5G, 0.6G, 0.7G, 0.8G, 0.9G or 1.0G (i.e., L>0.5G, L>0.6G, L>0.7G, L>0.8G, L>0.9G or L>1.0G).

In some embodiments, the sensing area 121 of the sensor device 12 is aligned with the opening 10O of the substrate 10, and L may be substantially identical to $$\frac{(W1 - W2)}{2}.$$

The distance D3 can be determined by a size (i.e., height) of the bumps 16 and the distance D2 can be determined by a size (i.e., height) of the bumps 16 and a size (i.e., thickness) of the sensor device 12. By controlling the values of G and L so that the relation of G and L meets the definition given in the equation (1), the stray signals (e.g., light) coming from a non-horizontal direction (e.g., the undesired ambient light entering the package structure 1 from the bottom side 1a of the package structure 1 with an incident angle $\theta_a$) can pass through the encapsulant 14 and reach the mask layer 102, be reflected between the second surface 12b of the sensor device 12 and the mask layer 102 of the substrate 10 several times to move toward the window 10O of the substrate 10, and finally leave the package structure 1 from the window 10O of the substrate 10. As a result, the amount of stray signals can be greatly reduced and the performance of the sensor device 12 can be improved.

Figure 4:
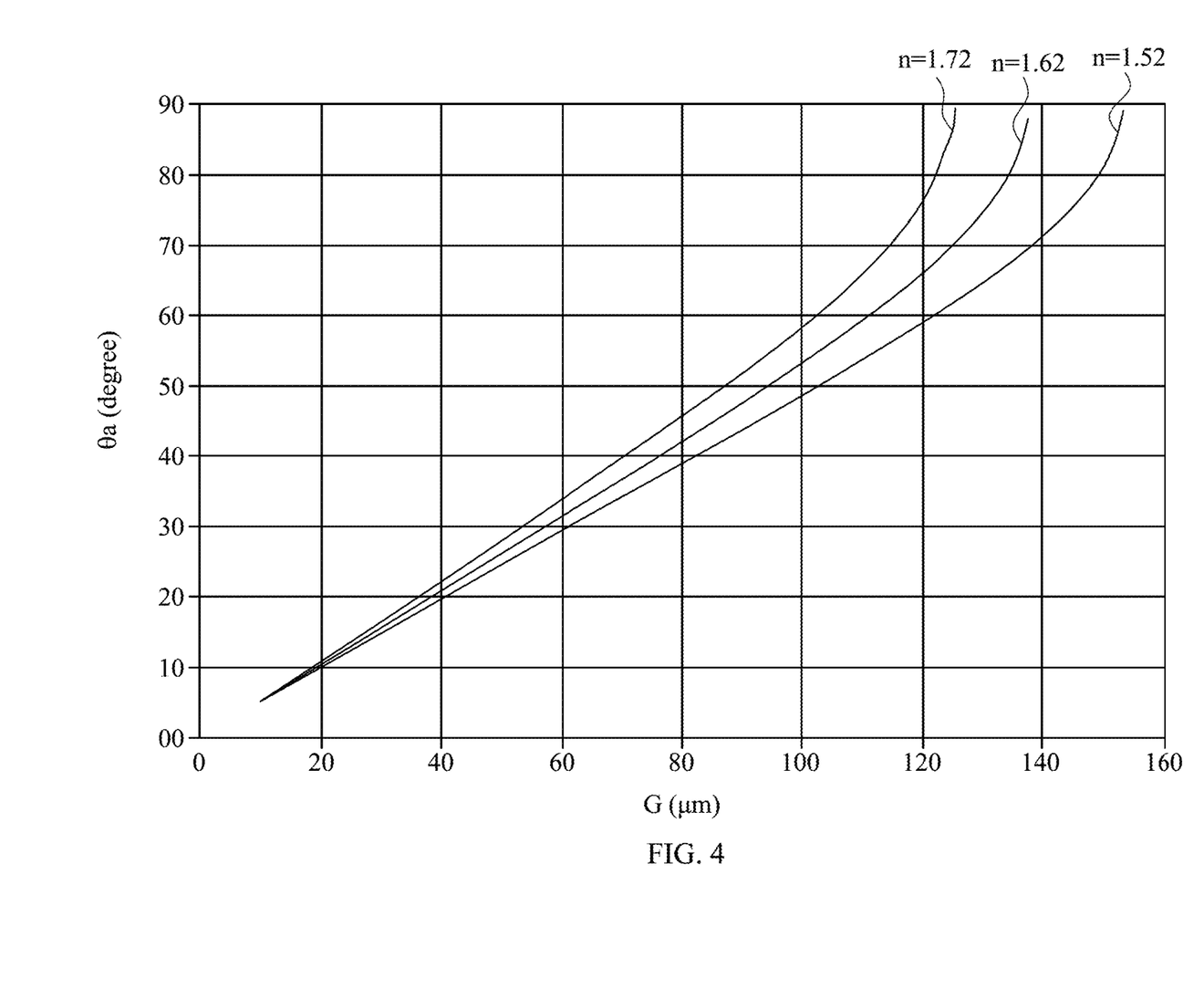
FIG. 4 illustrates the relation between G (the smallest horizontal distance from an edge of the first surface of the sensor device to the barrier) and θa (the incident angle of stray light) according to some embodiments of the present disclosure.

FIG. 4 illustrates the relation between G (i.e., the smallest horizontal distance from an edge of the first surface 12a of the sensor device 12 to the barrier 13) and $\theta_a$ (i.e., the incident angle of stray light) in the embodiments where D2 is 175 μm and n is the refractive index of the material for forming the encapsulant 14. D2 can be determined by the height of the bumps 16 and the thickness of the sensor device 12 once the sensor device 12 is selected and the size of the bumps 16 is determined. In the embodiments illustrated in FIG. 4, the encapsulant 14 is formed using an optical molding compound having a refractive index (n) of 1.72, 1.62 and 1.52, respectively.

When stray light moves from the ambient environment into the encapsulant 14 of the package structure 1, the direction of the stray light will be changed due to refraction. Such behavior will comply with Snell's law (equation (2)):

$$\frac{\sin\theta_a}{\sin\theta_b} = \frac{n_b}{n_a} \tag{2}$$

wherein $\theta_a$ is the incident angle, $\theta_b$ is the refraction angle, $n_a$ is the refractive index of air, and $n_b$ is the refractive index of the encapsulant. The refractive index $n_a$ is approximately 1. The refractive index $n_b$ depends on the material used for forming the encapsulant 14. In some embodiments, the encapsulant 14 is transparent and made of optical molding compound, and $n_b$ ranges from 1.5 to 1.75 (e.g., 1.5, 1.52, 1.55, 1.6, 1.62, 1.65, 1.7, 1.72 or 1.75). In some embodiments, $n_b$ may range from 1.5 to 1.6.

In some embodiments, $\theta_b$ may be represented by the following equation (3):

$$\theta_b \approx \tan^{-1}(G/D2) \tag{3}$$

The relation between G and $\theta_a$ can be obtained on the basis of equations (2) and (3) and is represented by the following equation (4):

$$\theta_a = \sin^{-1}\{n_b \times \sin[\tan^{-1}(G/D2)]\} \tag{4}$$

In view of equation (4), since D2 and the refractive index ($n_b$) of the encapsulant can be determined once the encapsulant, bumps and sensor device are decided, G can be determined based on the incident angle $\theta_a$ of stray light (e.g., the incident angle at which most of stray light enters the encapsulant) and the relation between G and ea can be obtained as shown in the embodiments illustrated in FIG. 4.

By designing the configuration of the barrier (including the value of D1), the package structure according to the present disclosure can block stray signals coming from the horizontal direction, including those passing through the substrate in the horizontal direction. In addition, by controlling the values of L and G, stray signals entering from the bottom side (i.e., back side) of the package structure can be guided and leave the package structure from the window 10O located at the top side (i.e., front side) without entering the sensing area 121 of the sensor device 12. Thus, the package structure according to the present disclosure may have ability of blocking light, evaluated by an optical density (O.D.) of 4.0 or more.

FIG. 5A, FIG. 5B, FIG. 5C, FIG. 5D and FIG. 5E illustrate one or more operations of a method for manufacturing the package structure 1 according to some embodiments of the present disclosure.

Figure 5A:
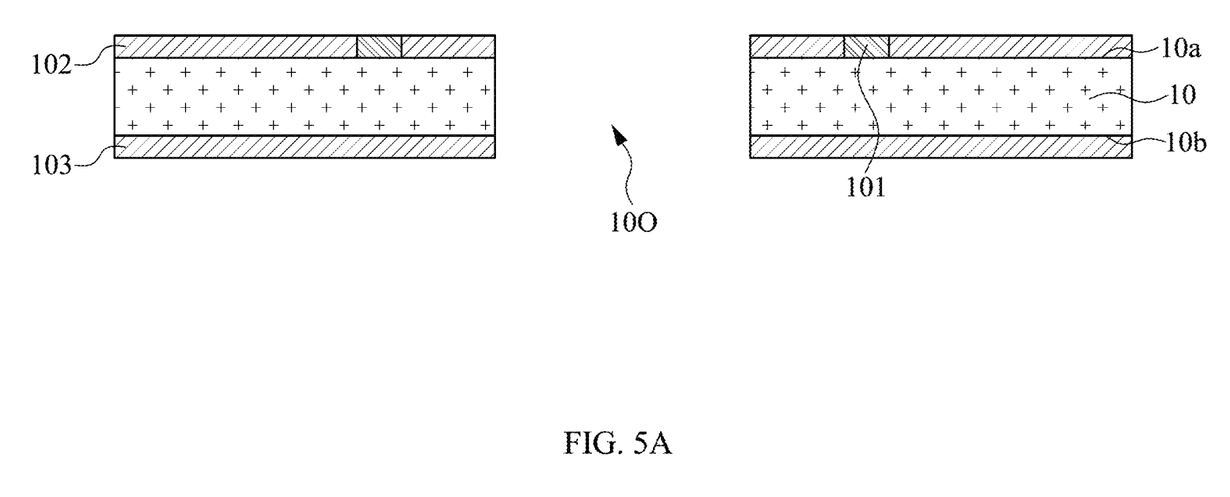
FIG. 5A, FIG. 5B, FIG. 5C, FIG. 5D and FIG. 5E illustrate one or more operations of a method for manufacturing a package structure according to some embodiments of the present disclosure.

Referring to FIG. 5A, a substrate 10 is provided. The substrate 10 has a first surface 10a, a second surface 10b opposite to the first surface 10a, and an opening 10O. The substrate 10 includes a plurality of pads 101 disposed on the first surface 10a, a mask layer 102 disposed on the first surface 10a, and a mask layer 103 disposed on the second surface 10b. The mask layer 102 surrounds the pads 101. The substrate 10 may further include traces or other conductive connections (not shown) disposed on the first surface 10a or within the substrate 10.

Figure 5B:
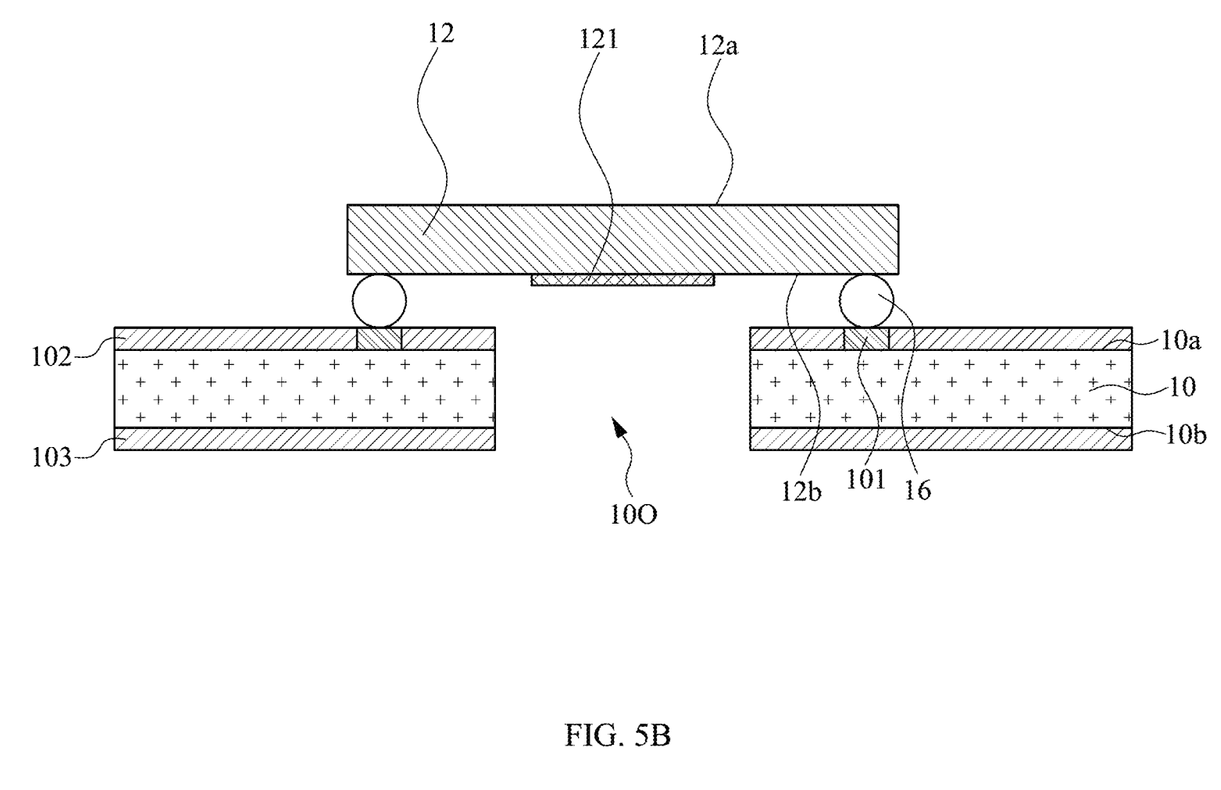

Referring to FIG. 5B, a sensor device 12 having a first surface 12a, a second surface 12b and a sensing area 121 located at the second surface 12b is provided. The sensor device 12 is disposed over the substrate 10 and electrically connected to the substrate 10 through a flip-chip bonding via a plurality of bumps 16. The bumps 16 may be disposed at a periphery or one or more edges of the second surface 12b of the sensor device 12. The sensing area 121 of the sensor device 12 faces the substrate 10.

Figure 5C:
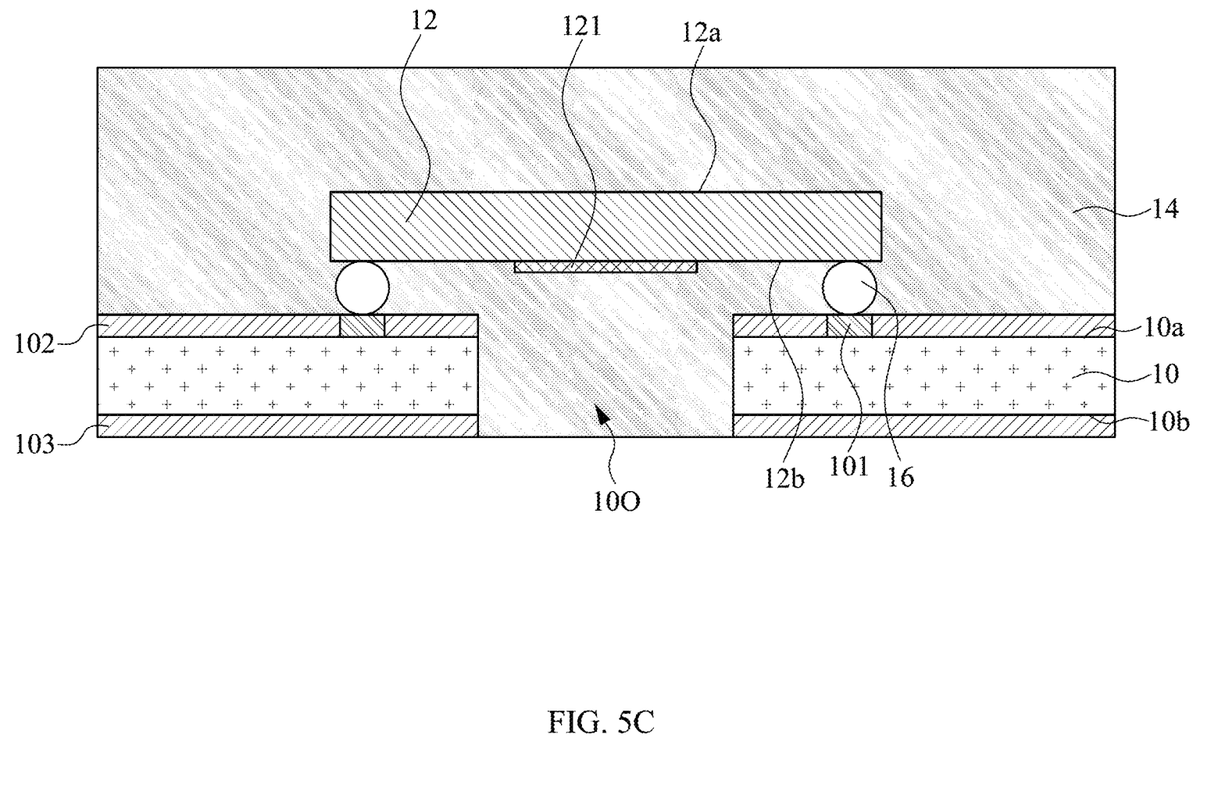

Referring to FIG. 5C, an encapsulant 14 is disposed to cover the sensor device 12 and the substrate 10. Specifically, the encapsulant 14 covers the first surface 12a, second surface 12b and lateral surfaces (not denoted) of the sensor device 12 as well as the mask layer 102 of the substrate 10. In addition, the encapsulant 14 fills in the gap between the second surface 12b of the sensor device 12 and the mask layer 102 of the substrate 10 and the opening 10O of the substrate 10. In some embodiments, the encapsulant 14 can be formed by using a molding compound via injection molding, transfer molding or compression molding, or other suitable operations.

Figure 5D:
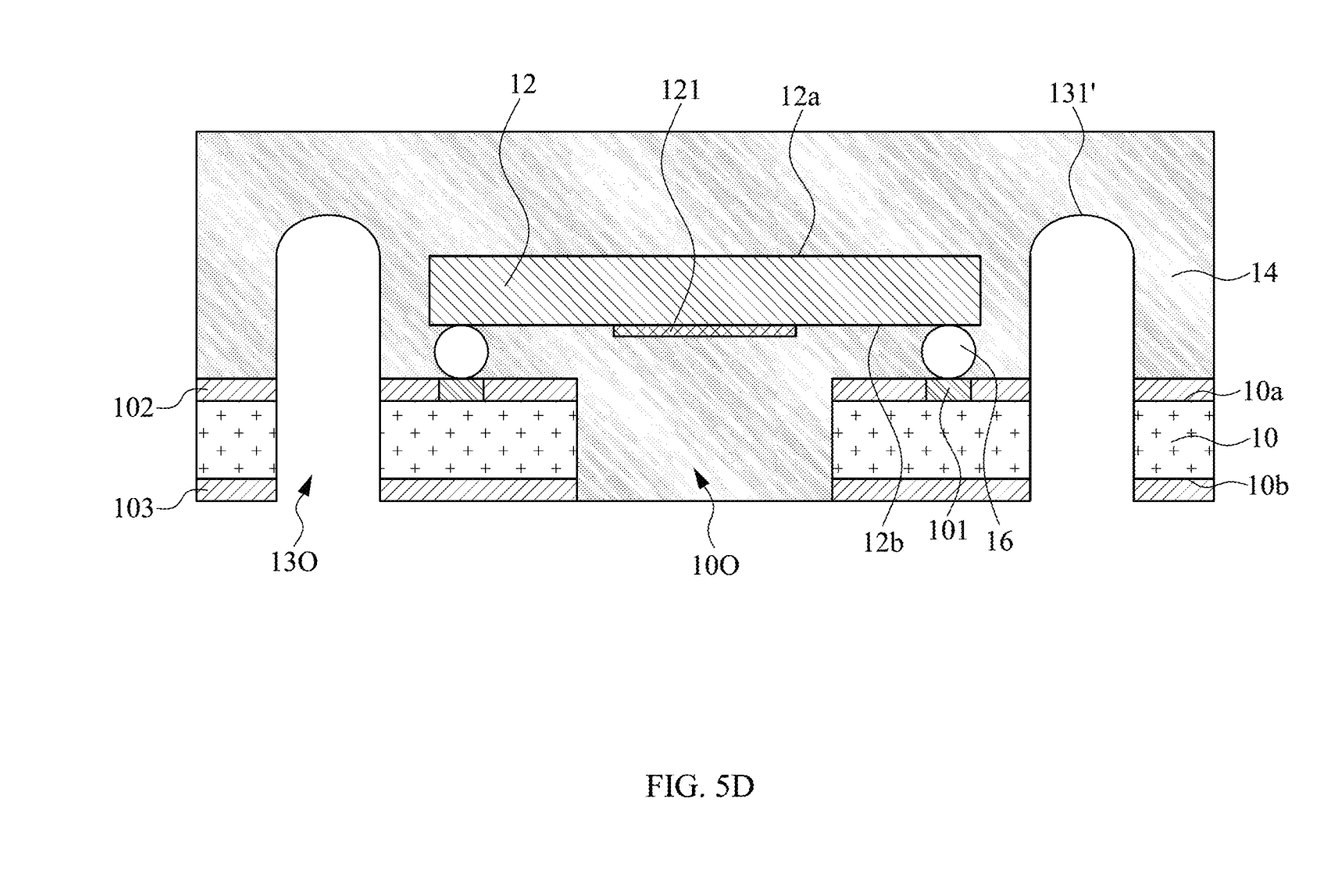

Referring to FIG. 5D, a trench 130 penetrating through the mask layer 102, the substrate 10 and the mask layer 103 and extending into the encapsulant 14 is formed, e.g., by laser drilling, blade sawing, or other suitable techniques. The trench 130 may surround the sensor device 12 or be formed adjacent to one or more lateral surfaces of the sensor device 12. The trench 130 has a distal end 131' buried in the encapsulant 14.

Figure 5E:
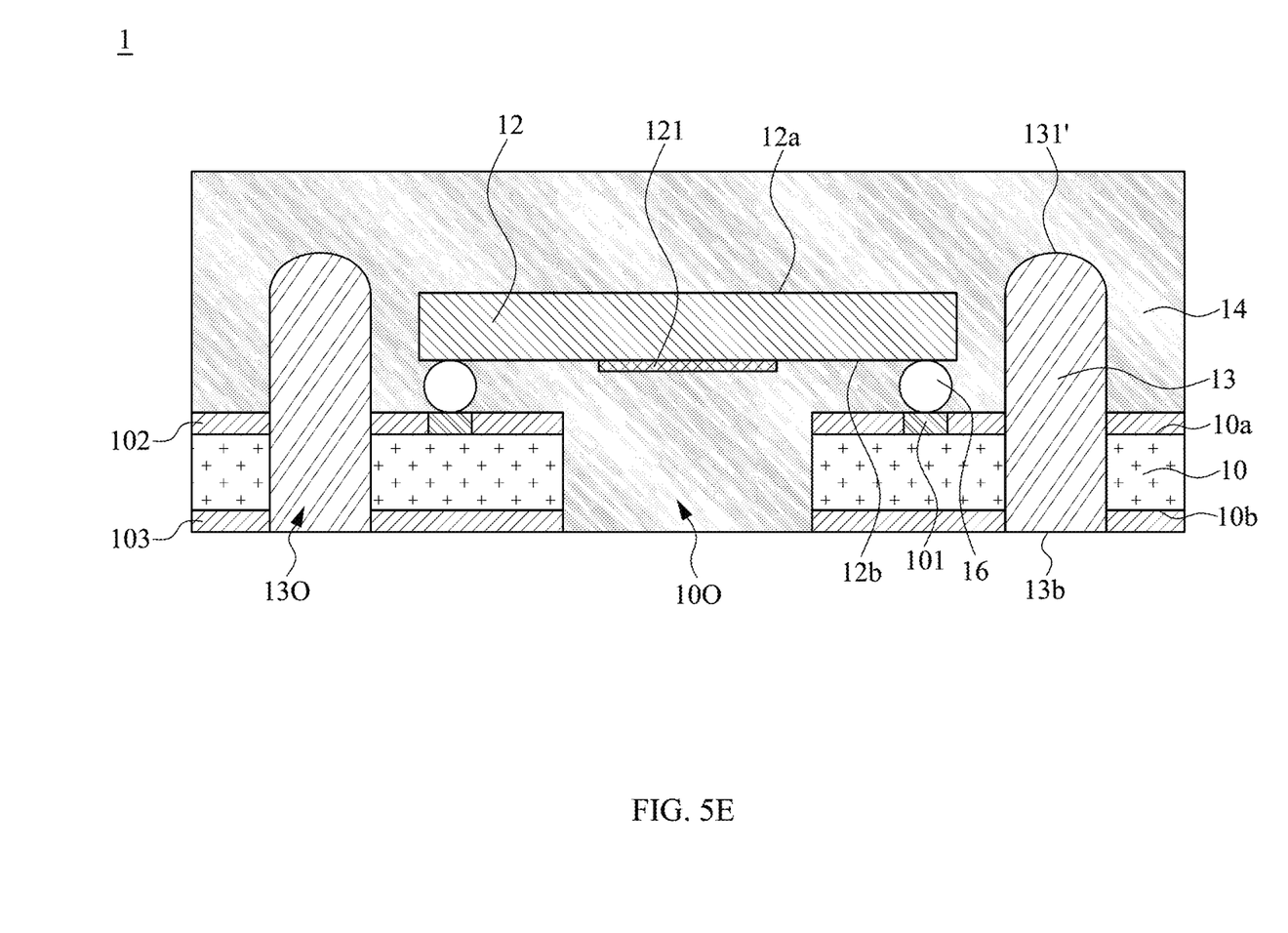

Referring to FIG. 5E, a signal blocking material (e.g., an underfill epoxy resin having a high optical density) is used to fill the trench 130. Thus, a signal blocking structure 13 extending from the substrate into the encapsulant 14 is formed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
a substrate having an opening;
a sensor device electrically connected to the substrate and having a sensing area facing the opening of the substrate;
an encapsulant covering the sensor device and the substrate and filling the opening of the substrate; and
a barrier penetrating through the substrate and extending into the encapsulant,
wherein the barrier surrounds the opening of the substrate and the sensing area of the sensor device.

2. The package structure of claim 1, wherein the sensing area of the sensor device is aligned with the opening of the substrate.

3. The package structure of claim 1, wherein the sensor device is electrically connected to the substrate through a flip-chip bonding.

4. The package structure of claim 1, wherein the sensor device has a first surface and a second surface opposite to the first surface, the sensing area is located at the second surface, a distance D1 from a distal end of the barrier to the substrate is greater than a distance D3 from the second surface of the sensor device to the substrate.

5. The package structure of claim 4, wherein the distance D1 from the distal end of the barrier to the substrate is greater than a distance D2 from the first surface of the sensor device to the substrate.

6. The package structure of claim 1, wherein the sensor device has a first surface and a second surface opposite to the first surface, the sensing area is located at the second surface, a smallest horizontal distance L from an edge of the sensing area to an edge of the opening of the substrate meets the following equation:

$$L > \frac{D3}{D2} \times G$$

wherein D2 is a distance from the first surface of the sensor device to the substrate, D3 is a distance from the second surface of the sensor device to the substrate, and G is a smallest horizontal distance from an edge of the first surface of the sensor device to the barrier.

7. The package structure of claim 1, wherein the barrier is opaque.

8. The package structure of claim 1, wherein the encapsulant is transparent.

9. The package structure of claim 1, further comprising a mask layer disposed on a surface of the substrate facing away from the sensor device, wherein a surface of the barrier is exposed from the surface of the mask layer.

10. A package structure comprising:
a substrate having an opening penetrating through the substrate;
a sensor device disposed over the substrate and having a sensing area aligned with the opening, wherein the sensor device has a first surface and a backside surface opposite to the first surface, and the sensing area is located at the first surface, and wherein the first surface of the sensor device faces the substrate; and
an encapsulant covering the sensor device and the substrate,
wherein the encapsulant fills in the opening.

11. The package structure of claim 10, further comprising a signal blocking structure disposed adjacent to the sensor device, configured to block signals from the backside surface of the sensor device.

12. The package structure of claim 11, wherein a top of the signal blocking structure is higher than the backside surface.

13. The package structure of claim 11, wherein the signal blocking structure is around the sensing area.

14. The package structure of claim 10, wherein an entire vertical projection of the sensing area is within the opening of the substrate.

15. A package structure comprising:
a substrate having an opening penetrating through the substrate;
a sensor device disposed over the substrate and having a sensing area aligned with the opening, wherein the sensor device has a first surface and a backside surface opposite to the first surface, and the sensing area is located at the first surface, and wherein the first surface of the sensor device faces the substrate;
an encapsulant covering the sensor device and the substrate; and
a signal blocking structure penetrating through the substrate.

16. The package structure of claim 15, wherein the signal blocking structure extends into the encapsulant.

17. The package structure of claim 16, wherein the encapsulant has a top surface away from the substrate, and the signal blocking structure is lower than the top surface of the encapsulant.

18. A package structure comprising:
a substrate having an opening penetrating through the substrate, wherein the substrate has a first surface and a second surface opposite to the first surface;
a sensor device disposed over the substrate and having a sensing area aligned with the opening, wherein the sensor device has a first surface and a backside surface opposite to the first surface, and the sensing area is located at the first surface, wherein the first surface of the sensor device faces the substrate, and wherein the first surface of the substrate faces the sensing area;
an encapsulant covering the sensor device and the substrate, wherein the encapsulant is coplanar with the second surface of the substrate; and
a signal blocking structure penetrating through the substrate and coplanar with the second surface of the substrate.

* * * * *